(12) United States Patent
Shimada et al.

(10) Patent No.: US 8,552,550 B2
(45) Date of Patent: Oct. 8, 2013

(54) SEMICONDUCTOR DEVICE

(75) Inventors: Junichi Shimada, Shiga (JP); Hidenori Shibata, Toyama (JP); Tsutomu Fujii, Osaka (JP); Hiromasa Fukazawa, Hyogo (JP); Nobuyuki Iwauchi, Osaka (JP); Takeya Fujino, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/397,826

(22) Filed: Feb. 16, 2012

(65) Prior Publication Data

US 2012/0139101 A1    Jun. 7, 2012

Related U.S. Application Data

(63) Continuation of application No. PCT/JP2010/004270, filed on Jun. 28, 2010.

(30) Foreign Application Priority Data

Aug. 21, 2009   (JP) .................................. 2009-192358

(51) Int. Cl.
*H01L 23/48*   (2006.01)
*H01L 23/52*   (2006.01)

(52) U.S. Cl.
USPC ........... 257/734; 257/210; 257/211; 257/773; 257/E23.024

(58) Field of Classification Search
USPC ................ 257/734–786, E23.01–E23.079, 257/E23.141–E23.179
See application file for complete search history.

(56) References Cited

U.S. PATENT DOCUMENTS

| | | | |
|---|---|---|---|
| 6,188,628 B1 | 2/2001 | Tomotani | |
| 6,436,807 B1 | 8/2002 | Cwynar et al. | |
| 7,241,558 B2 | 7/2007 | Huang et al. | |
| 7,541,625 B2 * | 6/2009 | Kawakami | 257/211 |
| 2001/0028591 A1 | 10/2001 | Yamauchi | |
| 2002/0184606 A1 | 12/2002 | Ohba et al. | |
| 2008/0282218 A1 | 11/2008 | Lee et al. | |
| 2009/0155990 A1 | 6/2009 | Yanagidaira et al. | |

FOREIGN PATENT DOCUMENTS

| | | |
|---|---|---|
| JP | 60-119749 | 6/1985 |
| JP | 61-115295 | 6/1986 |
| JP | 10-27799 | 1/1998 |
| JP | 2000-298987 | 10/2000 |
| JP | 2001-237323 | 8/2001 |
| JP | 2001-344979 | 12/2001 |
| JP | 2002-110809 | 4/2002 |
| JP | 2002-368088 | 12/2002 |
| JP | 2004-022631 | 1/2004 |
| JP | 2005-150389 | 6/2005 |
| JP | 2008-282017 | 11/2008 |
| JP | 2009-146966 | 7/2009 |
| JP | 2009-182056 | 8/2009 |

OTHER PUBLICATIONS

International Search Report of PCT Application No. PCT/JP2010/004270, dated Sep. 14, 2010.

* cited by examiner

*Primary Examiner* — Jasmine Clark
(74) *Attorney, Agent, or Firm* — Panasonic Patent Center

(57) ABSTRACT

Disclosed is a semiconductor device having a multilayer wiring structure, in which a dummy pattern is formed in a wiring void with favorable manufacturing efficiency. In a semiconductor device having a multilayer wiring structure, dummy pattern (21) is formed in relatively narrow wiring void (Area_S1) so as to extend in a direction different from that of dummy patterns (22, 23) formed in relatively wide wiring void (Area_S2).

11 Claims, 10 Drawing Sheets

SEMICONDUCTOR DEVICE

CROSS-REFERENCE TO RELATED APPLICATIONS

This is a continuation of PCT International Application PCT/JP2010/004270 filed on Jun. 28, 2010, which claims priority to Japanese Patent Application No. 2009-192358 filed on Aug. 21, 2009. The disclosures of these applications including the specifications, the drawings, and the claims are hereby incorporated by reference in their entirety.

BACKGROUND

1. Technical Field

The present invention relates to a semiconductor device, and more particularly, to a semiconductor device having a multilayer wiring structure.

2. Background Art

With an increase in integration density of large-scale integration circuits commonly called micro-processors, memories, or system LSIs, element dimensions such as a gate length of transistors and wiring pitches are being miniaturized. Here, in order to realize miniaturization of wirings, an embedded wiring structure commonly called a Damascene wiring in which wiring trenches are formed in an interlayer insulating film, and copper wirings are formed within the trenches is used in the manufacturing process. A general embedded wiring forming method is realized by forming wiring trenches in an interlayer insulating film, forming a metal film such as a copper film on the entire surface so as to fill the trenches, and removing a metal film formed at the outer side of the wiring trenches by chemical mechanical polishing (CMP).

However, since the polishing rate of CMP is greatly different from a copper film to an interlayer insulating film, a phenomenon of overpolishing of wiring thickness called erosion is likely to occur in positions where wiring density is high. On the other hand, a phenomenon of a decrease in wiring thickness called dishing is likely to occur in positions where a wiring width is large. From these phenomena, there is a problem in that the wiring thickness and the distribution of an interlayer insulating film become uneven depending on a wiring density and a wiring width, and planarity deteriorates. As a result, wiring pattern formation defects are caused, and wiring resistance and interwiring parasitic capacitance increase. Therefore, in the related art, a dummy pattern has been formed in a wiring void so as to decrease a difference in wiring density (refer to Unexamined Japanese Patent Publication No. 60-119749, Unexamined Japanese Patent Publication No. 2005-150389, and U.S. Pat. No. 7,241,558, for example).

Moreover, in recent years, the speed and integration density of semiconductor devices are progressing quickly. In this case, an increase in interwiring capacitance caused by the increase in integration density of wirings is a major cause of hindrance to realizing faster semiconductor devices. The dummy pattern may cause a great problem not only in an interwiring capacitance which it gives to its adjacent wirings but also in an interwiring capacitance which it gives to its upper or lower wirings. Therefore, in the related art, the dummy pattern has been formed while dodging a region overlapping the upper or lower wirings (refer to Unexamined Japanese Patent Publication No. 10-27799, for example).

SUMMARY

As semiconductor devices have been further miniaturized, it is necessary to further decrease the difference in wiring density. This requires inserting a dummy pattern in a narrow void between wirings. In a dummy pattern forming technique of the related art, although a dummy pattern having a rectangular shape, a T-shape, an H-shape, or the like is formed in a wiring void, when forming a dummy pattern in a narrow region between wirings, it is necessary to decrease the shape of the dummy pattern. As a result, in the dummy pattern forming technique of the related art, a dummy pattern equal to the minimum area rule determined by the design rule is formed in a narrow region. Since the dummy pattern equal to the minimum area rule is difficult to form in a manufacturing process, the dummy pattern peels off from an interlayer insulating film to become dust, which causes defects. Thus, it is difficult to form a dummy pattern in a narrow void between wirings with the dummy pattern forming technique of the related art like a dummy pattern that violates the minimum area rule. Therefore, there is required a technique of efficiently forming a dummy pattern regardless of the shape of wirings and the extension direction of wirings to decrease the difference in wiring density and forming a dummy pattern having a degree of margin with respect to the design rule, in particular the minimum area rule.

On the other hand, when a dummy pattern is formed while dodging a region overlapping the upper or lower wirings in order to decrease interwiring capacitance, it is difficult to decrease the difference in wiring density. When a dummy pattern is formed so as to overlap the upper or lower wirings, in order to realize faster semiconductor devices, it is necessary to estimate the accurate amount of an increase in the interwiring capacitance with respect to the upper or lower wirings and suppress an increase in the interwiring capacitance as much as possible in the designing stage.

In view of the above problems, an object of the present invention is to provide a semiconductor device having a multilayer wiring structure, in which a dummy pattern is formed in a wiring void with favorable manufacturing efficiency. Another object of the present invention is to form a dummy pattern so that an increase in the interwiring capacitance is suppressed as much as possible or the accurate amount of an increase in the interwiring capacitance can be estimated.

SOLUTION TO PROBLEM

In order to solve the above problems, the present invention provides the following means. That is, the present invention provides a semiconductor device having a multilayer wiring structure, including at least one wiring layer including a plurality of wirings and a plurality of dummy patterns formed in a void, wherein in the wiring layer, a dummy pattern is formed in a relatively narrow wiring void so as to extend in a direction different from that of a dummy pattern formed in a relatively wide wiring void. Specifically, the extension direction of the dummy pattern formed in the narrow wiring void is the same as the extension direction of a wiring that forms the narrow wiring void.

Preferably, a distance between a signal wiring and a dummy pattern adjacent thereto is larger than a distance between a power supply wiring and a dummy pattern adjacent thereto. Specifically, in the wiring layer, a dummy pattern extending in the same direction as the dummy pattern formed in the narrow wiring void is formed in a wide wiring void formed by signal wirings.

Moreover, preferably, the dummy pattern is formed in a region of a wiring layer located right above or below the wiring layer, the region overlapping a non-wiring formation region of the wiring layer in a plan view thereof. Specifically, the extension direction of the dummy pattern formed in the narrow wiring void is the same as a preferential wiring direction of the other wiring layer located right above or below the wiring layer.

Moreover, preferably, a shift in a planar direction between a central line of the dummy pattern formed in the narrow wiring void and a central line of a wiring formed in the other wiring layer is constant.

Moreover, preferably, the dummy pattern formed in the narrow wiring void is connected to a power supply wiring. Specifically, the power supply wiring is formed in the other wiring layer, and the dummy pattern formed in the narrow wiring void is connected to the power supply wiring through a via. Alternatively, the power supply wiring is a wiring that forms the narrow wiring void, and a wiring that connects the dummy pattern formed in the narrow wiring void to the power supply wiring is formed in the wiring layer.

Moreover, preferably, the dummy pattern formed in the narrow wiring void and the dummy pattern formed in the wide wiring void are formed in the same instance region. Specifically, the instance is a static random access memory (SRAM) block, a read only memory (ROM) block, an analog circuit block, or the like.

According to the present invention, it is possible to efficiently form a dummy pattern in a wiring void while maintaining a sufficient degree of margin with respect to the minimum area rule in a semiconductor device having a multilayer wiring structure. Moreover, it is possible to realize a semiconductor device capable of suppressing an increase in the interwiring capacitance or estimating the accurate amount of an increase in the interwiring capacitance.

DESCRIPTION OF EMBODIMENTS

First Exemplary Embodiment

Figure 1:
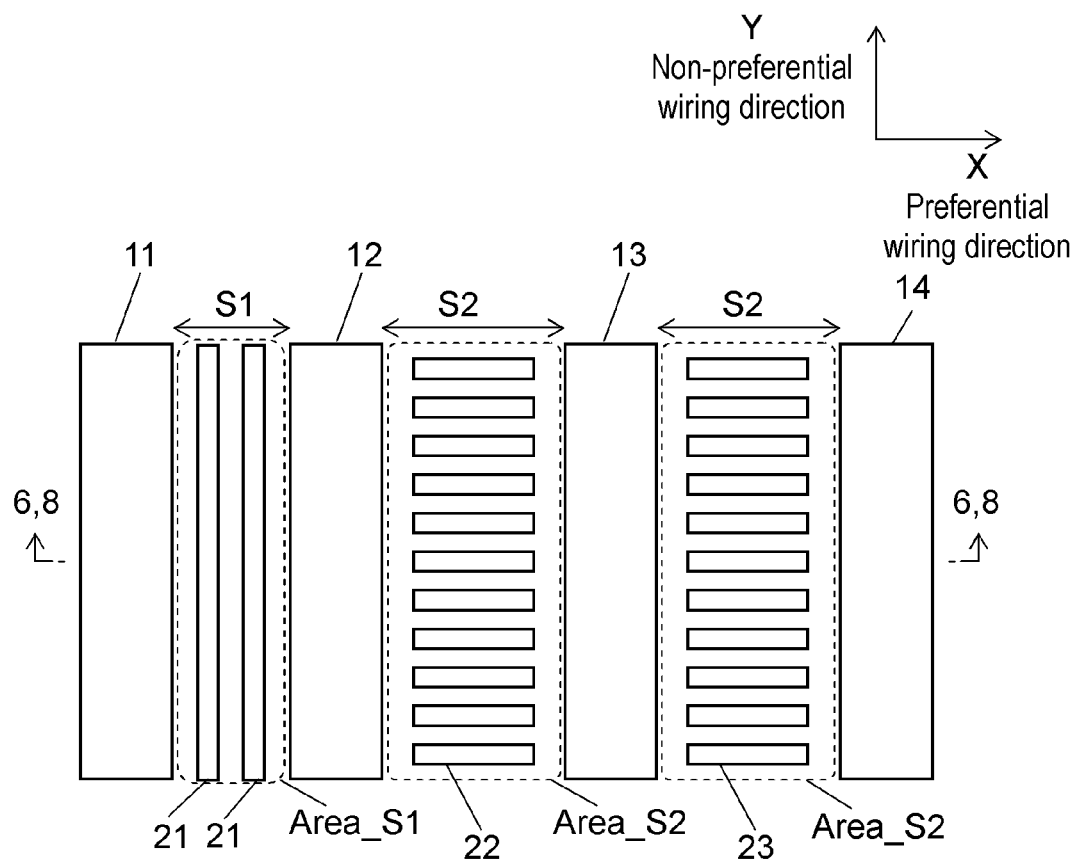
FIG. 1 is a partial plan view of one wiring layer of a semiconductor device according to a first exemplary embodiment.

FIG. 1 is a partial plan view of one wiring layer of a semiconductor device according to a first exemplary embodiment. Active wirings 11, 12, 13, and 14 are formed on wiring layer $M_x$. These wirings are copper wirings, aluminum wirings, or the like. The spacing between wirings 11 and 12 is S1, and the spacing between wirings 12 and 13 and the spacing between wirings 13 and 14 are S2 (where S1<S2). Wiring voids Area_S1 and Area_S2 defined by spacings S1 and S2, respectively, are dummy pattern formable regions where dummy patterns can be formed. The direction X is a preferential wiring direction of wiring layer $M_x$, and the direction Y is a non-preferential wiring direction. There is a rule for each wiring layer to preferentially lay out wirings in the vertical or horizontal direction, and the direction of laying out wirings preferentially is a preferential wiring direction. A non-preferential wiring direction is a direction orthogonal to the preferential wiring direction.

In general, a dummy pattern is inserted into the space of active wirings in order to improve an area ratio. Wirings and dummy patterns can be automatically laid out using a place and route (P&R) tool. The P&R tool lays out a dummy pattern extending in a preferential wiring direction in a dummy pattern formable region in accordance with the width W1, minimum length L_Min, and maximum length L_Max of a dummy pattern, the spacing S_DUM between dummy patterns, and the spacing S_SIG between a dummy pattern and an active wiring, which are defined by the user. The width of a dummy pattern is the short-side length of a linear dummy pattern, and the length thereof is the long-side length. The minimum length L_Min employs a value that sufficiently satisfies the minimum area rule defined by the semiconductor process. This is because it is difficult to manufacture a metal pattern having a size near the minimum area rule. This also aims to minimize a manufacturing risk caused by formation of a dummy pattern that is to be planarized.

If the minimum area rule is smaller than L_Min*W1 and S1<(S_SIG*2+L_Min)≤2, although it is possible to form a dummy pattern extending in a preferential wiring direction in wiring void Area_S2, it is not possible to form such a dummy pattern in wiring void Area_S1. Therefore, if wiring void Area_S1 is present continuously, a difference in area ratio occurs between wiring void Area_S1 and wiring void Area_S2, which has an adverse effect on planarization. On the other hand, when the area ratio of wiring void Area_S1 is increased using the P&R tool in order to realize planarization, a dummy pattern shorter in length than L_Min is formed in wiring void Area_S1. Since such a dummy pattern is close to the minimum area rule, it is highly likely to cause manufacturing defects. When manufacturing defects occur, formation defects may occur in active wirings near the dummy pattern or dust may adhere to the active wirings. In some cases, active wirings may be short-circuited, and the yield may decrease.

Therefore, dummy pattern 21 extending in a non-preferential wiring direction is formed in relatively narrow wiring void Area_S1. Since a sufficient region is present in the non-preferential wiring direction of wiring void Area_S1, it is possible to form dummy pattern 21 having a width of W1 and a length of L_Max. On the other hand, dummy patterns 22 and 23 extending in a preferential wiring direction are formed in relatively wide wiring void Area_S2 as usual. In this way, it is possible to adjust the area ratio while having a sufficient wiring area and to insert a dummy pattern in an empty region within a layout while suppressing the risk of manufacturing defects.

Figure 2:
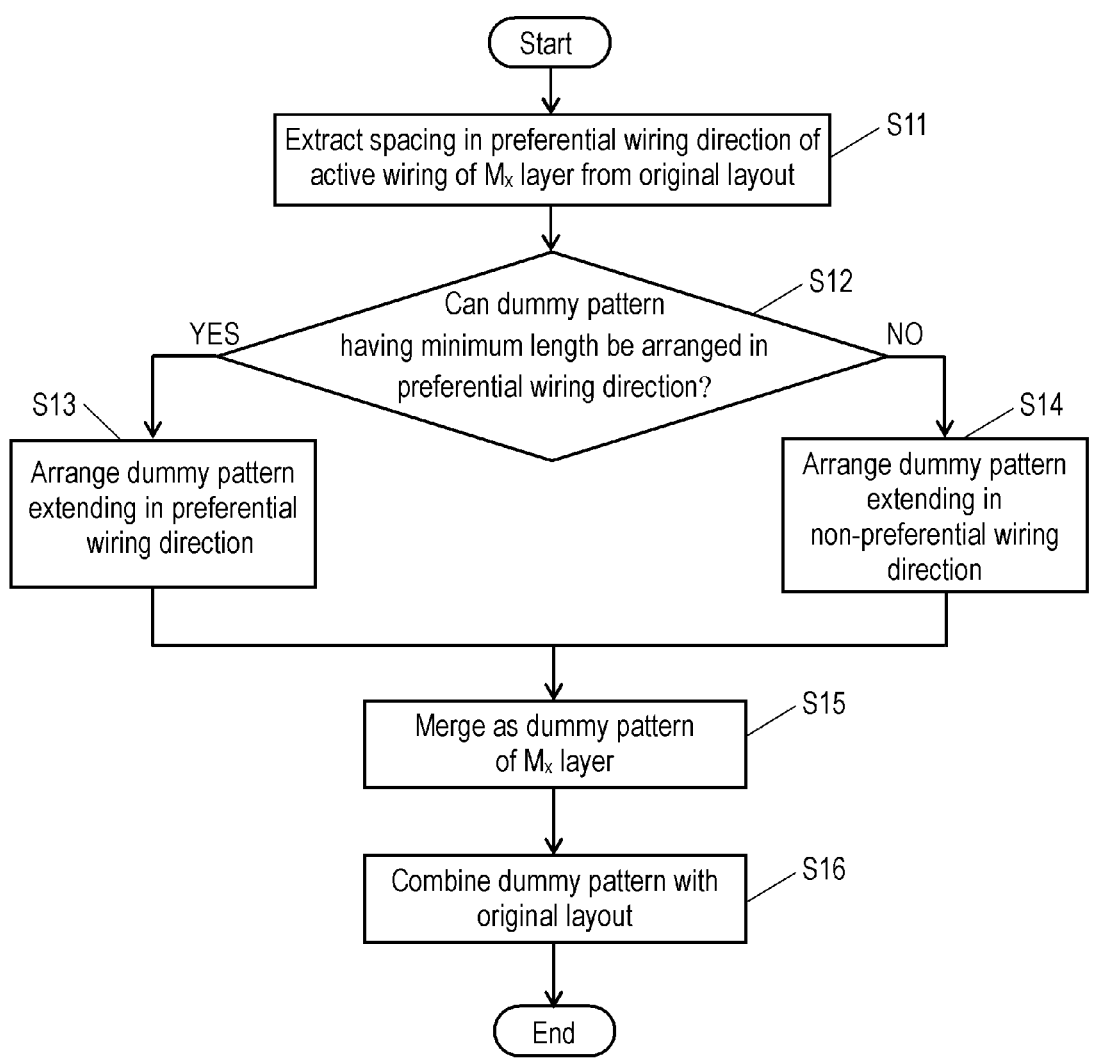
FIG. 2 is a flowchart of dummy pattern arrangement according to the first exemplary embodiment.

FIG. 2 shows the flowchart of dummy pattern arrangement according to the present exemplary embodiment. First, the spacing in the preferential wiring direction between active wirings on wiring layer $M_x$ is calculated from an original layout before dummy pattern arrangement (S11). Moreover, it is determined whether dummy patterns can be arranged with a minimum length of L_Min and a spacing of S_SIG in the preferential wiring direction of a dummy pattern formable region defined by the extracted spacing (S12). When it is determined that the dummy patterns can be arranged (S12: YES), dummy patterns extending in the preferential wiring direction are arranged (S13). When it is determined that the dummy patterns cannot be arranged (S12: NO), dummy patterns extending in the non-preferential wiring direction are arranged (S14). Moreover, the arranged dummy patterns are merged as dummy patterns of wiring layer $M_x$ (S15) and combined with the original layout (S16). The above processes are repeatedly performed with respect to the respective wiring layers or performed simultaneously with respect to all wiring layers.

With the above flow, it is possible to obtain layout data in which dummy patterns that sufficiently satisfy the minimum area rule determined by the process are arranged in large or small dummy pattern formable regions present between active wirings. Therefore, by manufacturing a semiconductor device in accordance with the layout data, it is possible to realize both planarization and reduction in the risks of process defects associated with the minimum area rule.

Figure 3:
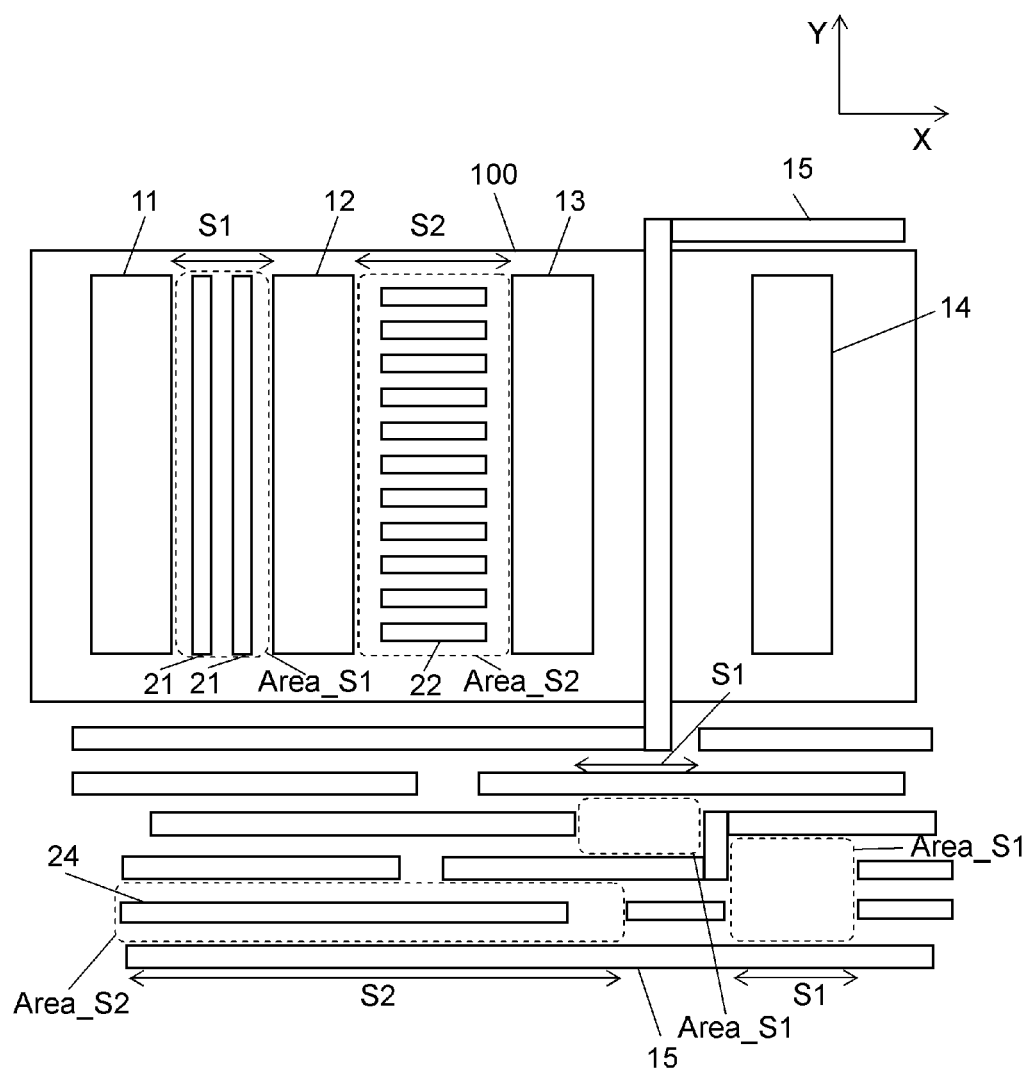
FIG. 3 is a partial plan view of one wiring layer of the semiconductor device according to the first exemplary embodiment.

FIG. 3 is a partial plan view of a larger scale than FIG. 1. Wirings 11 to 14 and dummy patterns 21 and 22 are formed in the region of instance 100. Instance 100 is a standard cell, a memory cell such as a SRAM or a ROM, an analog circuit block, or the like, for example. Instance 100 is registered in a library and is used as library information when performing the design with the P&R tool. Wiring 15 and dummy pattern 24 arranged in the preferential wiring direction with the P&R tool are formed in a design region outside the region of instance 100.

Since a wiring void in the region of instance 100 can be used as the design region of the P&R tool, it is not desirable to insert a dummy pattern in instance 100 in advance. Moreover, patterns extending in the preferential wiring direction and the non-preferential wiring direction coexist in the region of instance 100 in order to further decrease the area. Therefore, it is considered that a large number of narrow wiring voids are included in the region of instance 100. On the other hand, since wirings extending in the preferential wiring direction are dominant in the design region of the P&R tool, it is considered that a small number of narrow wiring voids are included in the design region. From these facts, it is considered that a difference in area ratio which has an adverse effect on planarization is likely to occur mainly in the region of instance 100. Therefore, by forming dummy patterns extending in the non-preferential wiring direction in narrow wiring void Area_S1 of the region of instance 100 and not forming the same in narrow wiring void Area_S1 of the design region of the P&R tool, it is possible to suppress an increase in the number of dummy patterns close to the minimum area rule and to suppress an increase in the interwiring capacitance. Moreover, since in a multilayer wiring structure, wiring layers are generally stacked so that the preferential wiring directions thereof are orthogonal to each other, by not forming dummy patterns extending in the non-preferential wiring direction in a region outside the region of instance 100 as much as possible, it is possible to suppress an increase in interwiring capacitance between wiring layers.

Second Exemplary Embodiment

Figure 4:
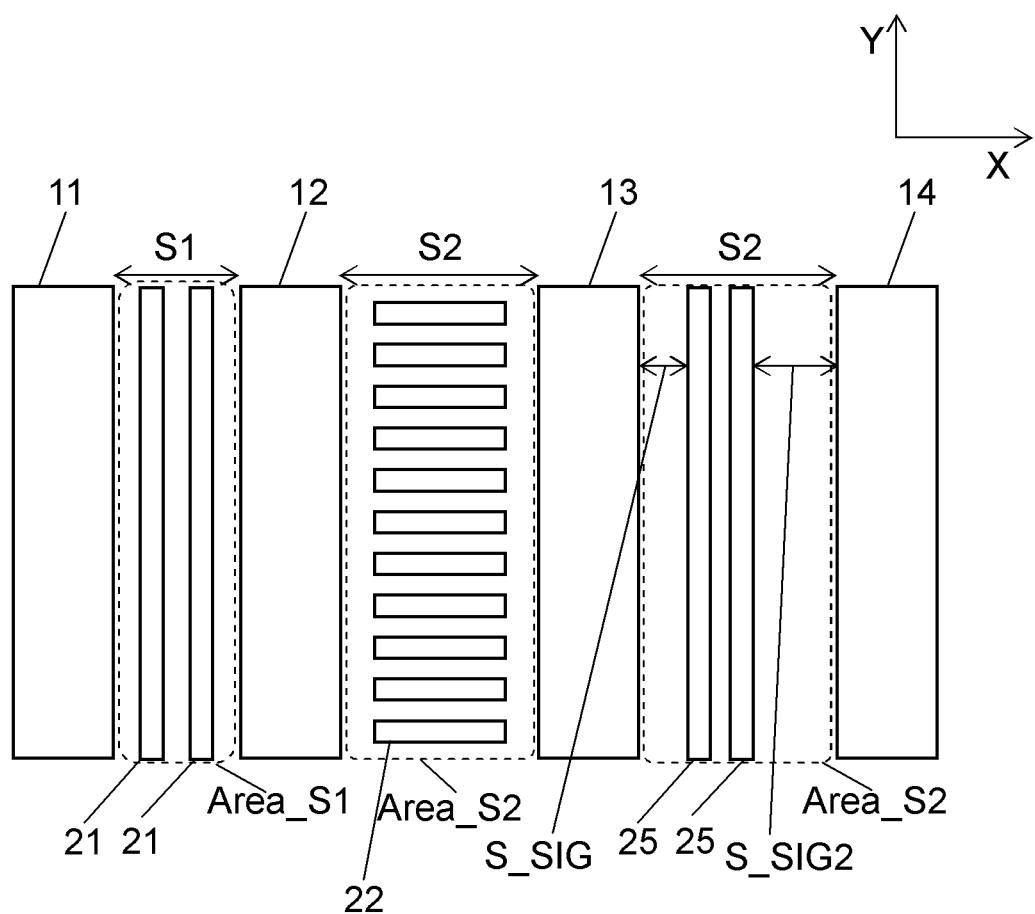
FIG. 4 is a partial plan view of one wiring layer of a semiconductor device according to a second exemplary embodiment.

FIG. 4 is a partial plan view of one wiring layer of a semiconductor device according to the second exemplary embodiment. Hereinafter, only the difference from the first exemplary embodiment will be described.

Wirings 11 to 13 are power supply wirings, and wiring 14 is a signal wiring for transferring clock signals, data signals, or the like. When dummy patterns are disposed near a signal wiring, the interwiring capacitance increases, which decreases signal transfer speed or increases power consumption. Therefore, it is preferable to separate dummy patterns from a signal wiring as much as possible. Specifically, the dummy patterns are separated from the signal wiring by a spacing of S_SIG2 (where, S_SIG2>S_SIG) or more. As a result, dummy pattern 25 extending in the non-preferential wiring direction is formed in a dummy pattern formable region between wirings 13 and 14. When wiring 11 is a signal wiring, the number of dummy patterns 21 in wiring void Area_S1 between wirings 11 and 12 is decreased so that wiring 11 and dummy pattern 21 are separated by the spacing of S_SIG2 or more.

Figure 5:
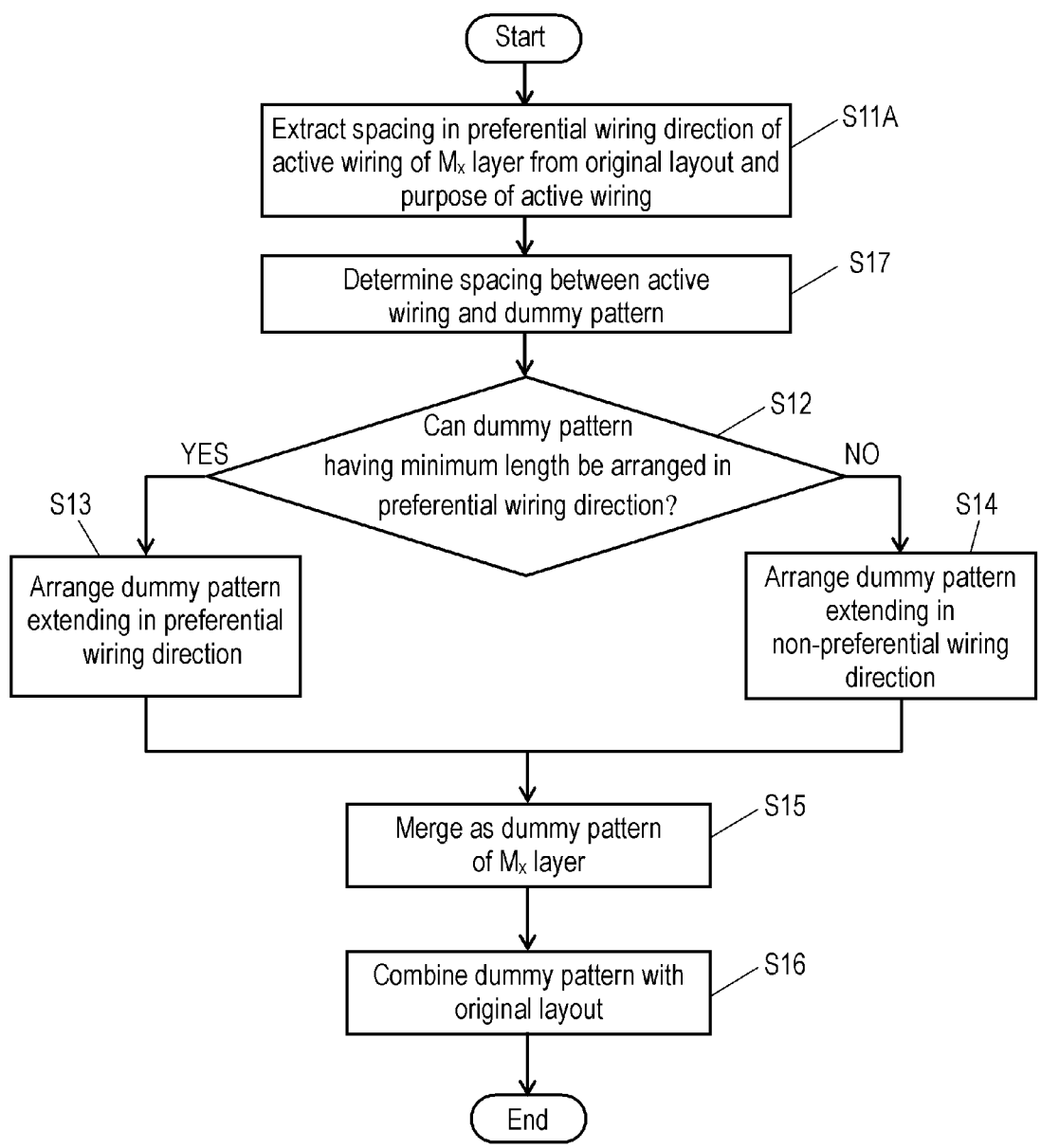
FIG. 5 is a flowchart of dummy pattern arrangement according to the second exemplary embodiment.

FIG. 5 shows the flow of dummy pattern arrangement according to the present exemplary embodiment. First, the spacing S in the preferential wiring direction of active wirings of wiring layer $M_x$ is calculated from an original layout before dummy pattern arrangement, and the purpose of the active wirings is extracted (S11A). Moreover, the spacing in relation to the dummy pattern is determined in accordance with the purpose of the active wirings (S17). The spacing is large when the purpose is a signal wiring and is small when the purpose is a power supply wiring. The processes of step S12 and the subsequent steps are the same as above.

According to the present exemplary embodiment, it is possible to realize both planarization and reduction in the risks of process defects associated with the minimum area rule while suppressing an increase in the interwiring capacitance which has an adverse effect on signal transfer properties.

Third Exemplary Embodiment

Figure 6:
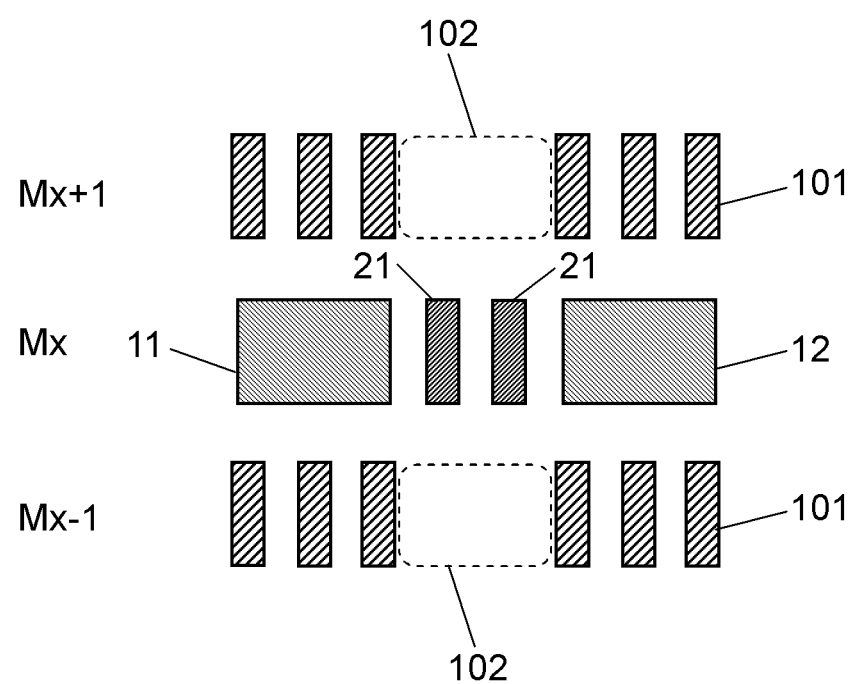
FIG. 6 is a partial cross-sectional view of a semiconductor device according to a third exemplary embodiment.

FIG. 6 is a partial cross-sectional view of a semiconductor device according to the third exemplary embodiment and is a cross-sectional view taken along the line 6-6, of a portion including wirings 11 and 12 of the semiconductor device shown in FIG. 1. Hereinafter, only the difference from the first embodiment will be described.

Wiring layers $M_{x+1}$ and $M_{x-1}$ in which a plurality of wirings 101 extending in the non-preferential wiring direction of wiring layer $M_x$ is formed are disposed right above and below wiring layer $M_x$. In these upper and lower wiring layers, region 102 which overlaps dummy pattern 21 formed in wiring layer $M_x$ in a plan view thereof is a non-wiring formation region where no wiring is formed. That is, in the upper and lower wiring layers, no active wiring is formed in the region which overlaps dummy pattern 21 in a plan view. Alternatively, dummy pattern 21 is not formed in a region of the upper and lower wiring layers, which overlaps a wiring formation region in a plan view thereof. In this way, it is possible to suppress an increase in the interwiring capacitance between wiring layers when dummy pattern 21 extending in the preferential wiring direction of wiring layers $M_{x+1}$ and $M_{x-1}$ is formed in wiring layer $M_x$.

Non-wiring formation region 102 may not need to be wider than dummy pattern 21 in a plan view thereof but may be equal to or narrower than dummy pattern 21. Moreover, non-wiring formation region 102 can be easily secured by extending dummy pattern 21 in a planar direction by a predetermined amount.

Figure 7:
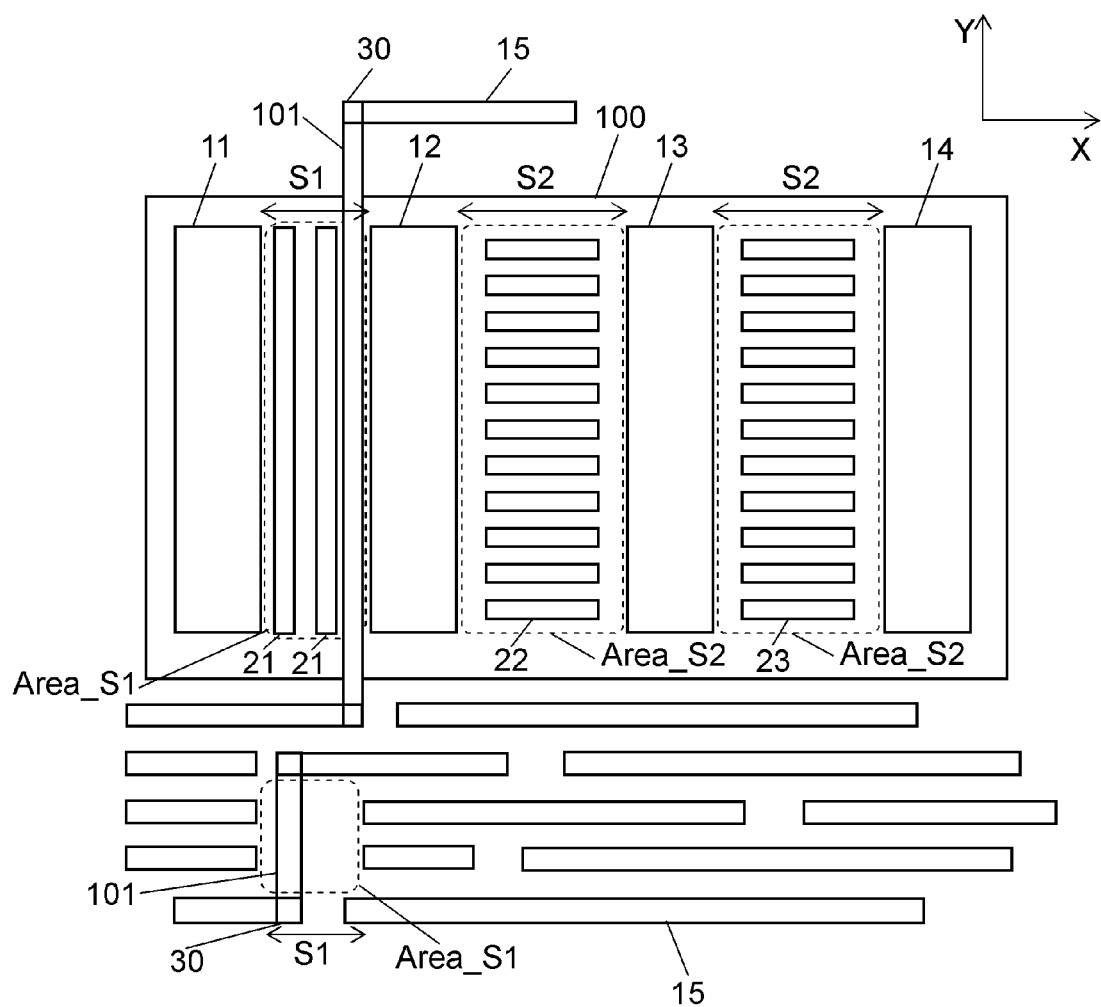
FIG. 7 is a partial plan view of one wiring layer of the semiconductor device according to the third exemplary embodiment.

FIG. 7 is a partial plan view of one wiring layer of the semiconductor device according to the present exemplary embodiment. A part of wiring 101 formed in a wiring layer located right above or below wiring layer $M_x$ extends over the region of instance 100. Wirings 101 and 15 are connected by a via 30. In general, in many cases, wiring 101 extending over the region of instance 100 is a long wiring. Dummy pattern 21 is also formed to be relatively long. Thus, in order to decrease the interwiring capacitance thereof, wiring 101 and dummy pattern 21 are formed so as not to overlap each other in a plan view thereof as described above. In this way, the interwiring capacitance added to wiring 101 decreases, and timing convergence properties are improved.

On the other hand, in many cases, in any wiring layer, the design region outside the region of instance 100 is crowded with wirings. Nevertheless, when a non-wiring formation region is secured, it is difficult to lay out wirings, and the chip size may increase. Since wirings extending in the preferential wiring direction are dominant in the design region, even when dummy patterns extending in the non-preferential wiring direction are formed in wiring void Area_S1, the length thereof is not so large. Thus, there is no particular problem even when active wirings are formed in the upper and lower wiring layers so as to overlap the dummy pattern extending in the non-preferential wiring direction in the design region. Therefore, whether or not to secure a non-wiring formation region in the design region may be determined by considering a wiring crowding state, timing convergence properties, or the like. Moreover, there is no need to pay a particular consideration to overlapping with dummy patterns extending in the preferential wiring direction.

According to the present exemplary embodiment, it is possible to realize both planarization and reduction in the risks of process defects associated with the minimum area rule while suppressing an increase in the interwiring capacitance between wiring layers.

Fourth Exemplary Embodiment

Figure 8:
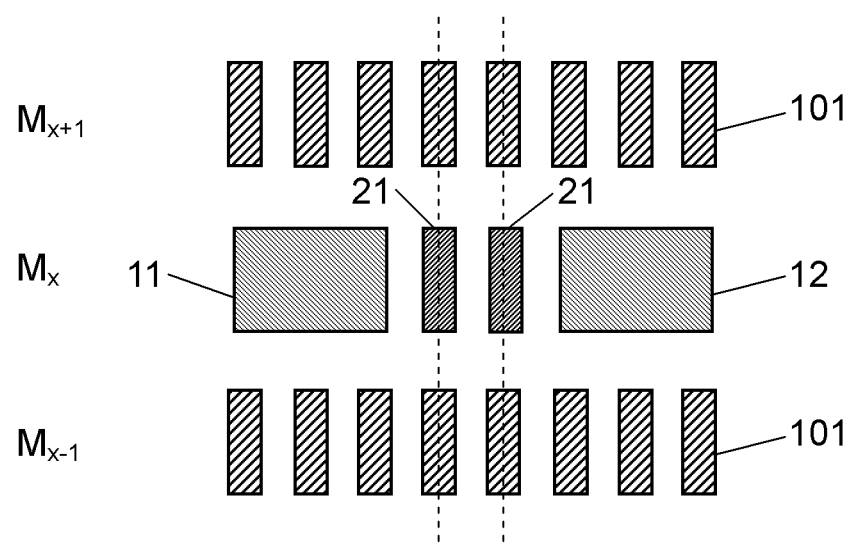
FIG. 8 is a partial cross-sectional view of a semiconductor device according to a fourth exemplary embodiment.

FIG. 8 is a partial cross-sectional view of a semiconductor device according to the fourth exemplary embodiment and is a cross-sectional view taken along the line 8-8, of a portion including wirings 11 and 12 of the semiconductor device shown in FIG. 1. Hereinafter, only the difference from the first embodiment will be described.

Wiring layers $M_{x+1}$ and $M_{x-1}$ in which a plurality of wirings 101 extending in the non-preferential wiring direction of wiring layer $M_x$ is formed are disposed right above and below wiring layer $M_x$. In these upper and lower wiring layers, wirings 101 are formed so as to overlap dummy pattern 21 formed in wiring layer $M_x$ in a plan view thereof. More specifically, dummy pattern 21 and wirings 101 are formed so that the central lines thereof (broken lines in the drawing) overlap each other. When dummy pattern 21 and wirings 101 are formed so as to be overlapped with each other by necessity without any regulation, the interwiring capacitance becomes uneven, and it becomes difficult to estimate the amount of increase in the interwiring capacitance. In some cases, it becomes necessary to insert buffers and use a standard cell having high driving capability, which may increase the chip size. Therefore, dummy pattern 21 and wirings 101 are formed so as to be overlapped with each other so that the central lines thereof overlap each other. In this way, the amount of an increase in the interwiring capacitance between wiring layers is made constant.

According to the present exemplary embodiment, it is possible to estimate the accurate amount of an increase in the interwiring capacitance, and it becomes easy to take timing convergence measures. Moreover, by making the central line of dummy pattern 21 identical to the central line of wiring 101, it is possible to calculate the interwiring capacitance quickly and improve accuracy. That is, as the positional relation between dummy pattern 21 and wiring 101 becomes constant, through the degeneration, calculating the interwiring capacitance becomes possible.

The central line of dummy pattern 21 may not be exactly identical to the central line of wiring 101, if the shift thereof is constant (for example, ½ of the minimum wiring width determined by the design rule or the like), it is possible to make the amount of an increase in the interwiring capacitance between wiring layers constant. In order to make the shift between the central lines constant, the position of dummy pattern 21 may be moved so as to comply with wiring 101, or the position of wiring 101 may be moved so as to comply with dummy pattern 21. Alternatively, both of them may be moved. A feasible method may be employed in accordance with a layout position. When it is not possible to make the shift between the central lines constant even when dummy pattern 21 and wiring 101 are moved, dummy pattern 21 may be removed within a range where there is no adverse effect on the area ratio.

Moreover, since the length of the dummy pattern extending in the non-preferential wiring direction in the design region is not so large, there is no particular problem even when the shift between the central lines of the dummy pattern and the active wirings of the upper and lower wiring layers is not constant. Thus, whether or not to make the shift between the central lines of the dummy pattern and the active wirings of the upper and lower wiring layers in the design region constant may be determined by considering a wiring crowding state, timing convergence properties, or the like.

Fifth Exemplary Embodiment

Figure 9:
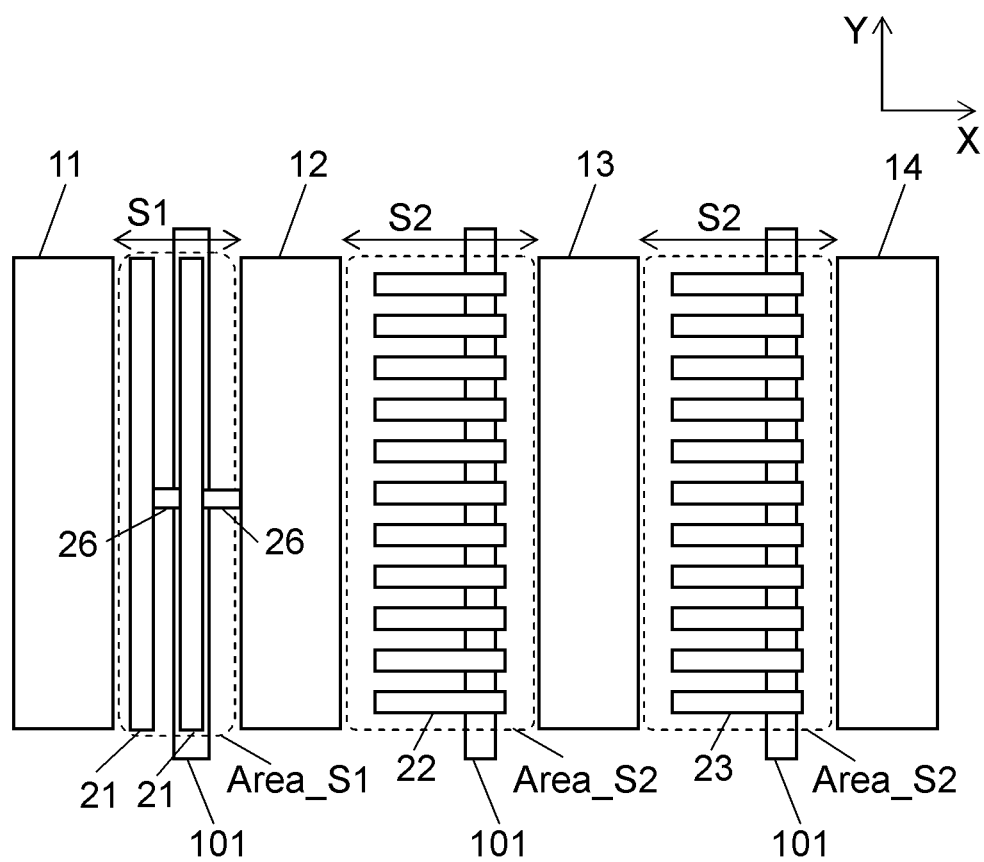
FIG. 9 is a partial plan view of one wiring layer of a semiconductor device according to a fifth exemplary embodiment.

FIG. 9 is a partial plan view of one wiring layer of a semiconductor device according to the fifth exemplary embodiment. Hereinafter, only the difference from the first embodiment will be described.

Figure 10:
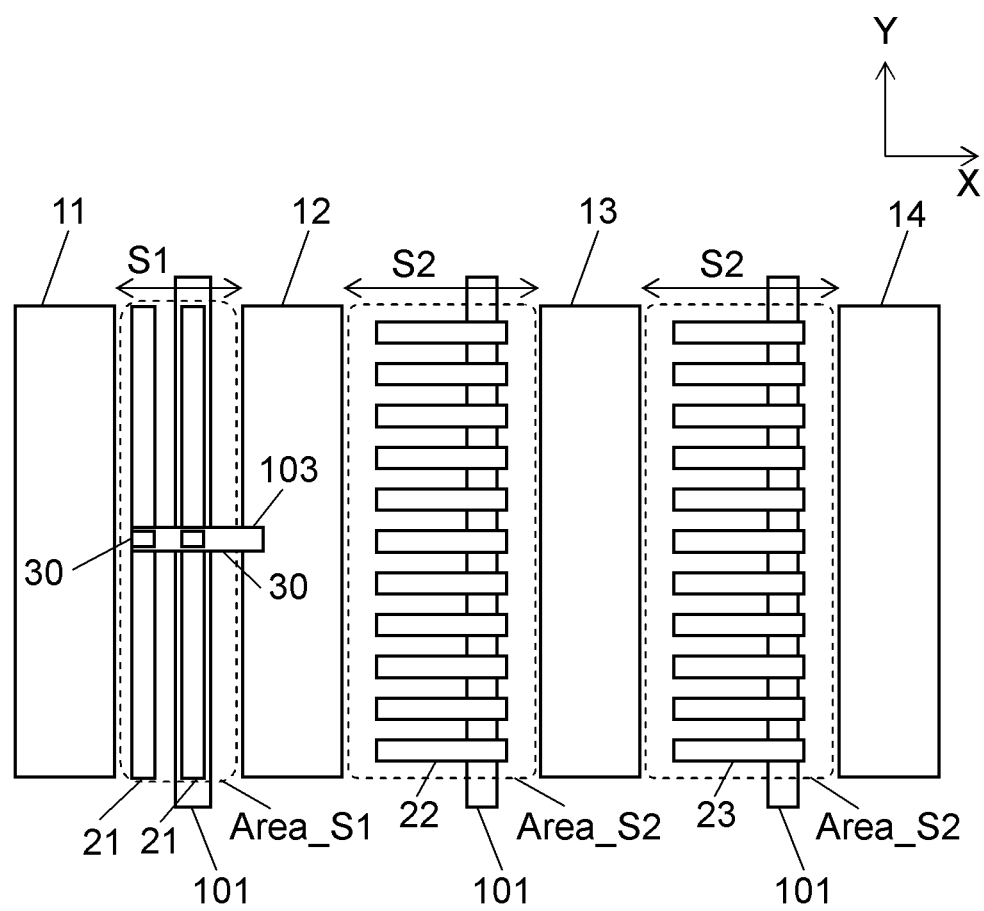
FIG. 10 is a partial plan view of one wiring layer of the semiconductor device according to a modified example of the fifth exemplary embodiment.

Wiring 12 is a power supply wiring at the ground or power supply potential. Wiring 12 and dummy pattern 21 are connected by wiring 26. That is, the potential of dummy pattern 21 is fixed at the ground potential. Since dummy pattern 21 extends in the same extension direction as active wiring 101 of other wiring layer unlike the other dummy patterns 22 and 23, the area overlapping wiring 101 is larger than that of the other dummy patterns 22 and 23. Thus, since the interwiring capacitance added to wiring 101 by dummy pattern 21 is relatively large, it is necessary to estimate the interwiring capacitance with high accuracy. Here, if dummy pattern 21 is not connected to any power supply wiring, since the potential thereof becomes indefinite, and it becomes difficult to estimate the interwiring capacitance, dummy pattern 21 is connected to power supply wiring 12 to fix the potential at a predetermined value. As shown in FIG. 10, dummy pattern 21 may be connected to wiring 103 of other wiring layer through via 30 so as to be connected to a power supply wiring of the other wiring layer.

According to the present exemplary embodiment, it is possible to estimate the accurate amount of an increase in the interwiring capacitance caused by dummy pattern 21, and it becomes easy to take timing convergence measures.

In the respective exemplary embodiments, the extension direction of dummy pattern 21 may not be identical to the extension direction of wirings 11 and 21. For example, the wirings may have an oblique wiring structure in which wirings extend in the direction of 45°, and dummy patterns may be arranged at an angle of 45° with respect to wirings without using the P&R tool. Moreover, the shape of the dummy pattern is not limited to a rectangular shape, but may be a T-shape, an H-shape, or the like, for example.

Since the semiconductor device according to the present invention has wiring voids having a high area ratio and excellent planarity, it is ideal as semiconductor devices which require a high degree of miniaturization.

What is claimed is:

1. A semiconductor device having a multilayer wiring structure, comprising a first wiring layer including a plurality of wirings and a plurality of dummy patterns, wherein
    a plurality of wiring voids is included in the first wiring layer, each of the plurality of wiring voids formed between a first and second ones of the plurality of wirings,
    the plurality of dummy patterns is formed in the plurality of wiring voids in the first wiring layer,
    the plurality of wiring voids comprises a relatively narrow wiring void and a relatively wide wiring void,
    the plurality of dummy patterns includes a first predetermined number of dummy patterns formed in the relatively narrow wiring void and extending in a first direction in the first wiring layer and a second predetermined number of dummy patterns formed in the relatively wide wiring void and extending in a second direction perpendicular to the first direction in the first wiring layer.

2. The semiconductor device of claim 1, wherein the plurality of wires extends in the first direction.

3. The semiconductor device of claim 1, wherein
    the plurality of wirings comprises a signal wiring and a power supply wiring,
    a distance between the signal wiring and one of the plurality of dummy patterns adjacent to the signal wiring is larger than a distance between a power supply wiring and a dummy pattern adjacent to the power supply wiring.

4. The semiconductor device of claim 1, wherein the plurality of dummy patterns includes a third predetermined number of dummy patterns formed in the relatively wide wiring void and extending in the first direction.

5. The semiconductor device of claim 1, wherein a first region in the first wiring layer defined by the plurality of dummy patterns overlays a second region in an upper wiring layer having no wiring.

6. The semiconductor device of claim 1, wherein a first region in the first wiring layer defined by the plurality of dummy patterns overlays a second region in a lower wiring layer having no wiring.

7. The semiconductor device of claim 1, wherein the first direction in which the first predetermined number of dummy patterns formed in the relatively narrow wiring void extends is same as a preferential wiring direction of a second wiring layer located immediately above or below the first wiring layer.

8. The semiconductor device of claim 1, wherein a central axis of a wiring formed in a second wiring layer is aligned with a central axis of one of the plurality of dummy patterns formed in the first wiring layer in a plan view.

9. The semiconductor device of claim 1,
    wherein a first region formed by the plurality of dummy patterns is included in a static random access memory (SRAM) block.

10. The semiconductor device of claim 1,
    wherein a first region formed by the plurality of dummy patterns is included in a read only memory (ROM) block.

11. The semiconductor device of claim 1,
    wherein a first region formed by the plurality of dummy patterns is included in an analog circuit block.

* * * * *